(12) United States Patent
Tan

(10) Patent No.: US 6,859,473 B1
(45) Date of Patent: Feb. 22, 2005

(54) CONTROLLING MODULATION AND BIAS OF LASER DRIVERS

(75) Inventor: Qingsheng Tan, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 21 days.

(21) Appl. No.: 10/286,728

(22) Filed: Nov. 1, 2002

(51) Int. Cl.$^7$ ............................................. H01S 3/00
(52) U.S. Cl. ................ 372/38.02; 372/38.1; 372/38.01; 372/38.04; 372/38.07
(58) Field of Search ........................... 372/38.1, 38.01, 372/38.02, 38.04, 38.07

(56) References Cited

U.S. PATENT DOCUMENTS

| 6,014,235 A | | 1/2000 | Norte | |
| 6,560,258 B1 | * | 5/2003 | McQuilkin | ............... 372/38.02 |
| 6,618,406 B1 | * | 9/2003 | Kaminishi | ............... 372/38.02 |
| 2003/0002551 A1 | * | 1/2003 | Kwon et al. | ............. 372/38.02 |
| 2003/0086455 A1 | * | 5/2003 | Ciubotaru et al. | ....... 372/38.02 |

* cited by examiner

*Primary Examiner*—Minsun Oh Harvey
*Assistant Examiner*—James Menefee
(74) *Attorney, Agent, or Firm*—Perkins Coie LLP

(57) ABSTRACT

A method for controlling a modulation current and a bias current of a laser driver includes generating a differential signal that has a voltage offset, for setting the modulation current, over a pair of differential inputs from a pre-driver circuit to a laser driver circuit. A voltage is generated for setting the bias current over a bias/monitor pin from the pre-driver circuit to the laser driver circuit. The voltage offset is sensed at the laser driver circuit and the modulation current is set based on the voltage offset. The voltage is sensed at the laser driver circuit and the bias current is set based on the voltage. A photo current is delivered over the bias/monitor pin from the laser driver circuit to the pre-driver circuit wherein no interaction occurs between the photo current and the voltage. The voltage is then modified based on the photo current.

15 Claims, 7 Drawing Sheets

CONTROLLING MODULATION AND BIAS OF LASER DRIVERS

CROSS-REFERENCE TO RELATED APPLICATIONS

This application is related to U.S. patent application Ser. No. 10/086,162, filed on Feb. 26, 2002, entitled "Controlling the Extinction Ratio of Optical Transmitters", which is incorporated herein by reference.

FIELD OF THE INVENTION

The present invention relates to laser modulation and more specifically to fiber optical transmitters using direct laser modulation.

BACKGROUND OF THE INVENTION

Maintaining a constant optical emission of laser diodes at logic level "0" or "P0" and logic level "1" or "P1" is a primary goal for optimal optical transmitter design to meet the requirements of high-speed fiber-optic applications. A proper laser bias current (corresponding to P0) must be established to minimize laser turn-on/turn-off delay caused by insufficient biasing. An appropriate bias current also limits the sensitivity penalty of optical receivers introduced by inadequate signal extinction ratio from over-biasing. A well-controlled laser modulation current (corresponding to P1) ensures meeting channel optical power budget without exceeding the optical receiver overload level Proper bias current and modulation current are accomplished by using an automatic power control (APC) loop and an automatic modulation control (AMC) loop. Alternatively, an extinction ratio control (ERC) loop can be used in place of an AMC loop.

For optical modules, it is desirable to integrate the laser diode and the driver in the same package or subassembly, since it is cost-effective for high-speed applications. Integration allows for minimizing the interface circuit between the laser and the driver for performance optimization. Under such circumstances, thermal management and space availability become critical for compact optical transmitter assemblies. This is due largely in part to the tight temperature range of operation for most lasers. As a result, a minimum driver die size is required to simplify the driver functionality for power saving requirements. Another requirement is that lasers may need a part-to-part adjustment for optimized bias and modulation currents. Therefore, it is beneficial to implement the APC and AMC loops separate from the laser-driver chip.

FIG. 1 is a block diagram of a prior art system 10 for controlling modulation and bias currents of a laser driver. System 10 has the APC and AMC loops incorporated into the pre-driver circuit, but are not shown. A laser diode 150, a laser driver 30 and a monitor diode 160 are assembled in a compact header 40. A high speed differential data signal is sent to the laser driver 30 at ports D+ and D−. The driver modulation and bias currents are set at Mod and Bias, respectively. The current from the monitor diode 160 is sensed at Monitor. Additionally, there are power supply ($V_{CC}$) and ground (GND) ports. As can be seen, when the APC and AMC circuits are incorporated into the pre-driver 20, a total of seven pin connections are required to connect the pre-driver 20 to the header 40.

However, most low-cost/compact high-speed packages only have five pin connections, wherein the laser driver 30 and various other components reside in the header 40 of a package.

Accordingly, methods and techniques are needed to enable the APC and AMC to be incorporated into the pre-driver 30 and yet still utilize a low-cost/compact high-speed package with only 5 pins.

SUMMARY OF THE INVENTION

The present invention contemplates a variety of improved methods and systems for multiplexing a bias voltage and monitor current over a single pin as well incorporating a voltage offset into a differential signal. At a laser driver, the voltage offset is uncoupled from the differential signal. The design of the pre-driver circuit enables the bias voltage and monitor current to be multiplexed on the same pin without any undue influence.

A method for controlling a modulation current and a bias current of a laser driver, in accordance with the present invention, includes generating a differential signal that has a voltage offset, for setting the modulation current, over a pair of differential inputs from a pre-driver circuit to a laser driver circuit. A voltage is generated for setting the bias current over a bias/monitor pin from the pre-driver circuit to the laser driver circuit. The voltage offset is sensed at the laser driver circuit and the modulation current is set, based on the voltage offset. The voltage is sensed at the laser driver circuit and the bias current is set based on the voltage. A photo current is delivered over the bias/monitor pin from the laser driver circuit to the pre-driver circuit wherein no interaction occurs between the photo current and the voltage. The voltage is then modified based on the photo current.

A pre-driver circuit, in accordance with the present invention, for controlling a laser driver, that generates a differential signal which includes an offset component and is communicated over a pair of differential inputs to a laser driver circuit.

A laser-driver circuit, in accordance with the present invention, for driving a laser based on a differential signal received from a pre-driver circuit over a pair of differential inputs wherein the differential signal includes an offset for setting a modulation current.

A system for controlling a modulation current and a bias current of a laser driver, in accordance with the present invention, includes a pre-driver circuit receptive to a differential signal, a bias set voltage, a modulation set voltage and a photo current and is operative to develop an offset differential signal and a voltage wherein the photo current is utilized for setting an offset component of the offset differential signal. A laser driver circuit is receptive to the offset differential signal and the voltage and is operative to develop the photo current wherein the laser driver circuit uses the offset component of the offset differential signal to set a modulation current and the voltage for setting a bias circuit.

A header, in accordance with the present invention, for connecting and housing a laser driver circuit, a laser diode and a monitor diode, requiring only five connection pins, to a pre-driver circuit, requiring only five connection pins, comprising a pair of differential connection points, a bias/monitor connection point, a power connection point and a ground.

A pre-driver circuit for controlling a laser driver, in accordance with the present invention, includes a gain stage coupled to a pair of differential inputs and a power supply line. An output driver is coupled to a pair of outputs of the gain stage, a pair of differential outputs and an input. A current sensor/voltage driver is coupled to a bi-directional input/output, a bias control input and an output. Also included is an APC-AMC/ERC controller that is coupled to the bias control input, the output of the current sensor/voltage driver and the input of the output driver.

A laser driver circuit for driving a laser, in accordance with the present invention, includes a common-mode voltage sensor coupled to a pair of differential inputs, a pair of differential signal outputs and a modulation control output. An output driver is coupled to the pair of differential signal outputs, the modulation control output, a bias control input and a laser signal output. Also included is a voltage sensor coupled to a monitor diode current input, the bias control input of the output driver and a bi-directional input/output.

An output driver for a pre-driver, in accordance with the present invention, includes a first pair of NPN transistors coupled to a power supply line, a pair of differential outputs and an input of a first current source wherein the pair of NPN transistors is responsive to the pair of differential inputs and the power supply line. A second pair of NPN transistors are also coupled to the pair of differential outputs, a voltage reference and a second current source.

A current sensor/voltage divider, in accordance with the present invention, includes a bias voltage generator coupled to a bias control input and a bandgap voltage reference. A first PNP transistor is coupled to the bias voltage generator, a power supply and a ground. A second PNP transistor is coupled to the power supply, the bias control input, and the ground. A third PNP transistor is coupled to the bias control input and the ground. A first NPN transistor is coupled to the third PNP transistor and the ground. A second NPN transistor is coupled to a ground wherein a base of the second NPN transistor is coupled to the collector of the second NPN transistor. Also included is a pair of PNP transistors coupled to the ground and the output of the current sensor/voltage divider wherein both bases of the pair of PNP transistors are coupled to the fifth PNP transistor.

The present invention allows for the advantages of incorporating the APC and AMC/ERC functions into a pre-driver circuit and yet still utilize a smaller package size for the laser and driver assembly that only has five pins to connect to a pre-driver circuit.

These and other advantages of the present invention will become apparent to those skilled in the art upon a reading of the following detailed descriptions and a study of the various figures.

DETAILED DESCRIPTION OF THE INVENTION

Figure 1:
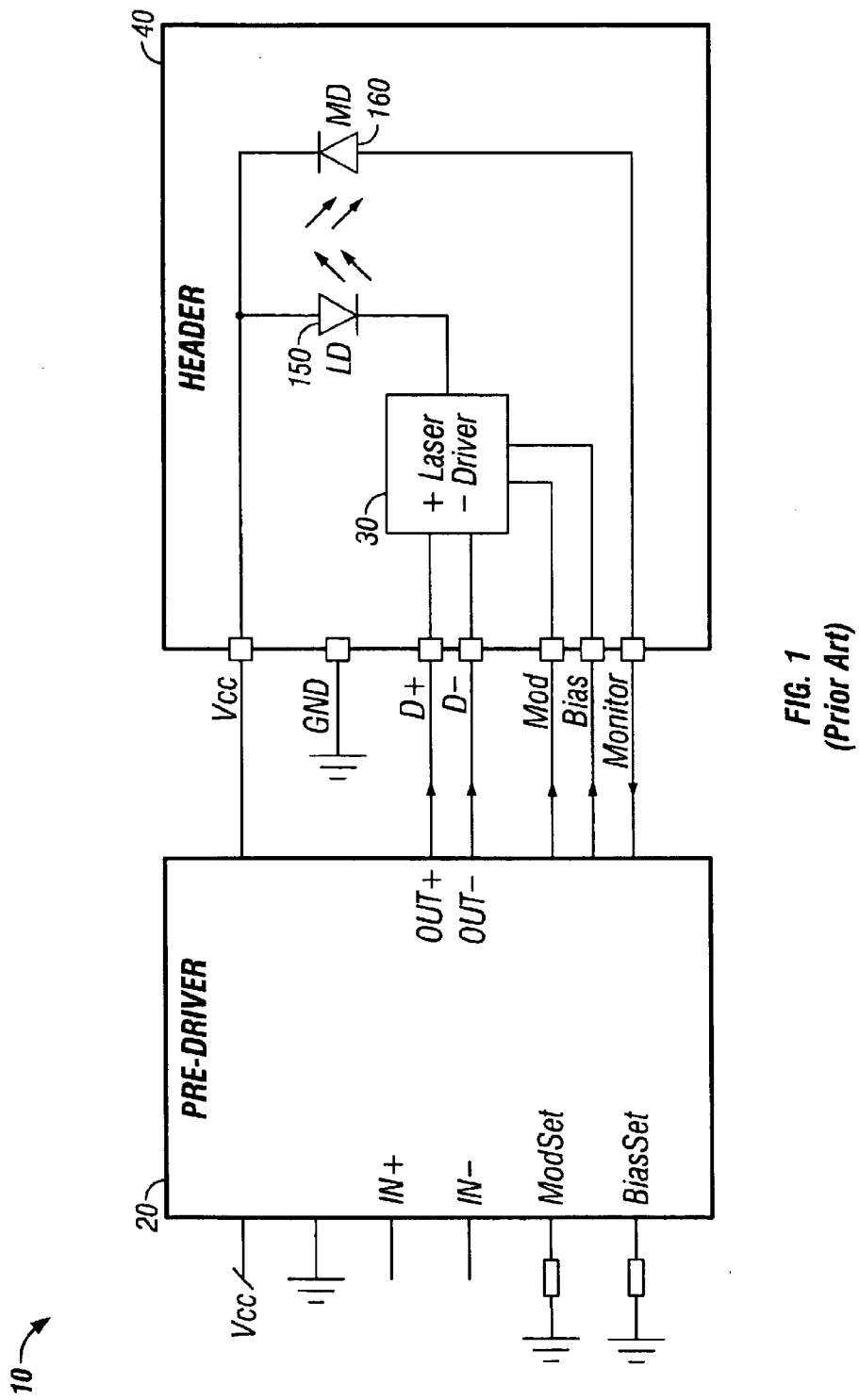
FIG. 1 is a block diagram of a prior art system for controlling modulation and bias currents of a laser driver.
Figure 2:
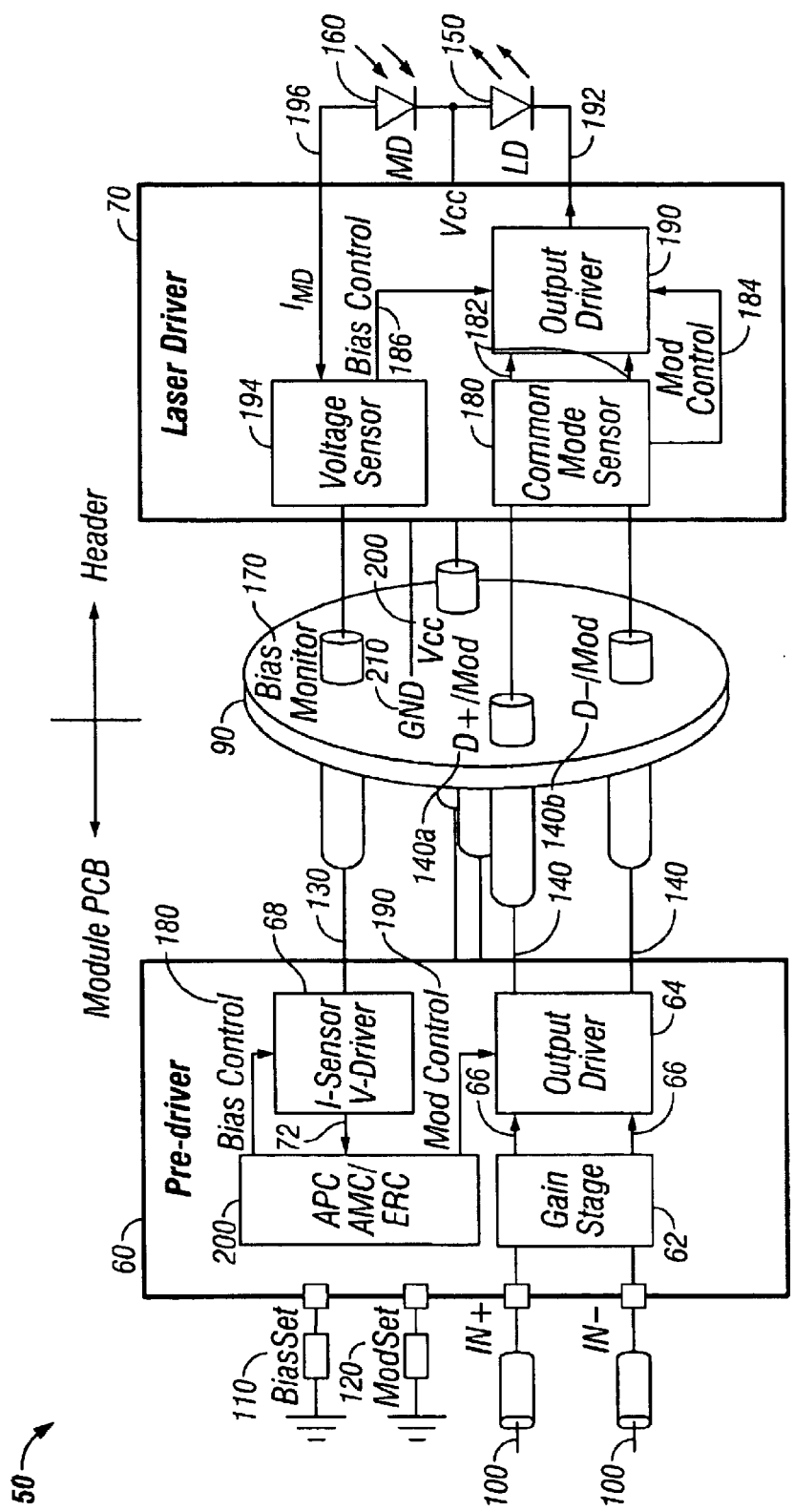
FIG. 2 is a block diagram of a pre-driver connected to a laser driver via a header, in accordance with the present invention.

FIG. 1 was described in reference to the prior art. FIG. 2 is a block diagram 50 of a pre-driver 60 connected to a laser driver 70 via a header 90, in accordance with the present invention. The pre-driver circuit 60 includes a gain stage 62 coupled to a pair of differential inputs 100 and a power supply line (not shown). An output driver 64 is coupled to a pair of outputs 66 of the gain stage 62, a pair of differential outputs 140 and a modulation control input 190. A current sensor/voltage driver 68 is coupled to a bi-directional input/output 130, a bias control input 180 and an output 72. Also included is an APC and AMC/ERC controller 200 that is coupled to the bias control input 180, the output 72 of the current sensor/voltage driver 68 and the modulation control 190.

The laser driver 70 includes a common mode sensor 180 coupled to a pair of differential inputs 140, a pair of differential signal outputs 182 and a modulation control output 184. An output driver 190 is coupled to the pair of differential signal outputs 182, the modulation control output 184, a bias control input 186 and a laser signal output 192. Also included is a voltage sensor 194 coupled to a monitor diode current input 196, the bias control input 186 of the output driver 190 and the bi-directional input/output 130.

The pre-driver circuit 60 is receptive to a differential signal received over a pair of differential inputs 100, a bias set voltage received over input 110, a modulation set voltage received over input 120 and a photo current ($I_{MD}$), received over a bi-directional input/output 130. The pre-driver circuit 60 is operative to develop an offset differential signal sent over differential outputs 140 and a voltage sent over bi-directional input/output 130. The photo current is utilized for setting an offset component of the offset differential signal. A laser driver circuit 70 is receptive to the offset differential signal sent over the differential outputs 140 and the voltage sent over bi-directional input/output 130. Circuit 70 is operative to develop the photo current, received over bi-directional input/output 130, wherein the laser driver circuit 70 uses the offset component of the offset differential signal to set a modulation current and the voltage for setting a bias circuit. In the context of the present invention, it should be that the phrases "offset differential signal", "differential signal with a voltage offset" and variations thereof, refer to a differential signal with a DC ("direct current") voltage added to the differential signal.

With further reference to FIG. 2, the laser driver 70, which is typically implemented as an integrated circuit, is assembled together with a laser diode 150 and a monitor diode 160, in a header 90 of a package. The pre-driver circuit 60, which is also typically implemented as an integrated circuit, is located out of the header assembly 90 on a module board (not shown). The pre-driver 60 reshapes the differential input signal and then forwards the high-speed differential data signal to the header assembly at two inputs pins: D+/Mod 140a and D−/Mod 140b. The pre-driver 60 adjusts the common-mode voltage or offset of its differential output voltage for setting the laser modulation current. The pre-driver also delivers a voltage to the header bias/monitor pin 170 for setting the laser bias current.

The laser driver 70, located inside of the header 90, senses the common-mode voltage or offset of the differential inputs (D+/Mod 140a, D−/Mod 140b) at the common mode sensor 180 and sets the current swing of the output driver 190. The output driver 190 directly modulates the laser diode 150 at the data rate with a current swing proportional to the control voltage. The laser driver 70 also delivers a laser bias current according to the setting voltage at the bias/monitor pin 170, generated by the pre-driver 60. The photo current ($I_{MD}$) of the monitor diode 160 is fed back to the pre-driver 60 through the same bias/monitor pin 170. The design of the laser driver 70 and pre-driver 60 guarantees that the bias sensing voltage and the photo current will not interfere with each other. This will be more fully explained in a subsequent section.

The pre-driver detects the photo current transmitted from the laser driver 70 and adjusts both the bias control signal 180 and modulation control signal 190 by closing the APC and AMC/ERC loops 200. The laser optical emission will eventually reach the pre-determined bias and modulation levels set at the BiasSet pin 170 and ModSet pin 140a/140b. In the this manner, the D+/Mod 140a, D−/Mod 140b and Bias/Monitor 170 pins are assigned for duplex function and the laser control loops are closed outside the header assembly 90. Both the laser driver 70 and the laser diode 150 are powered at the $V_{CC}$ pin 200. The header case pin 210 is utilized as a ground. Since the pre-driver 60 and the laser driver 70 operate in a closed loop mode, circuit offsets introduced will be automatically corrected.

Figure 3:
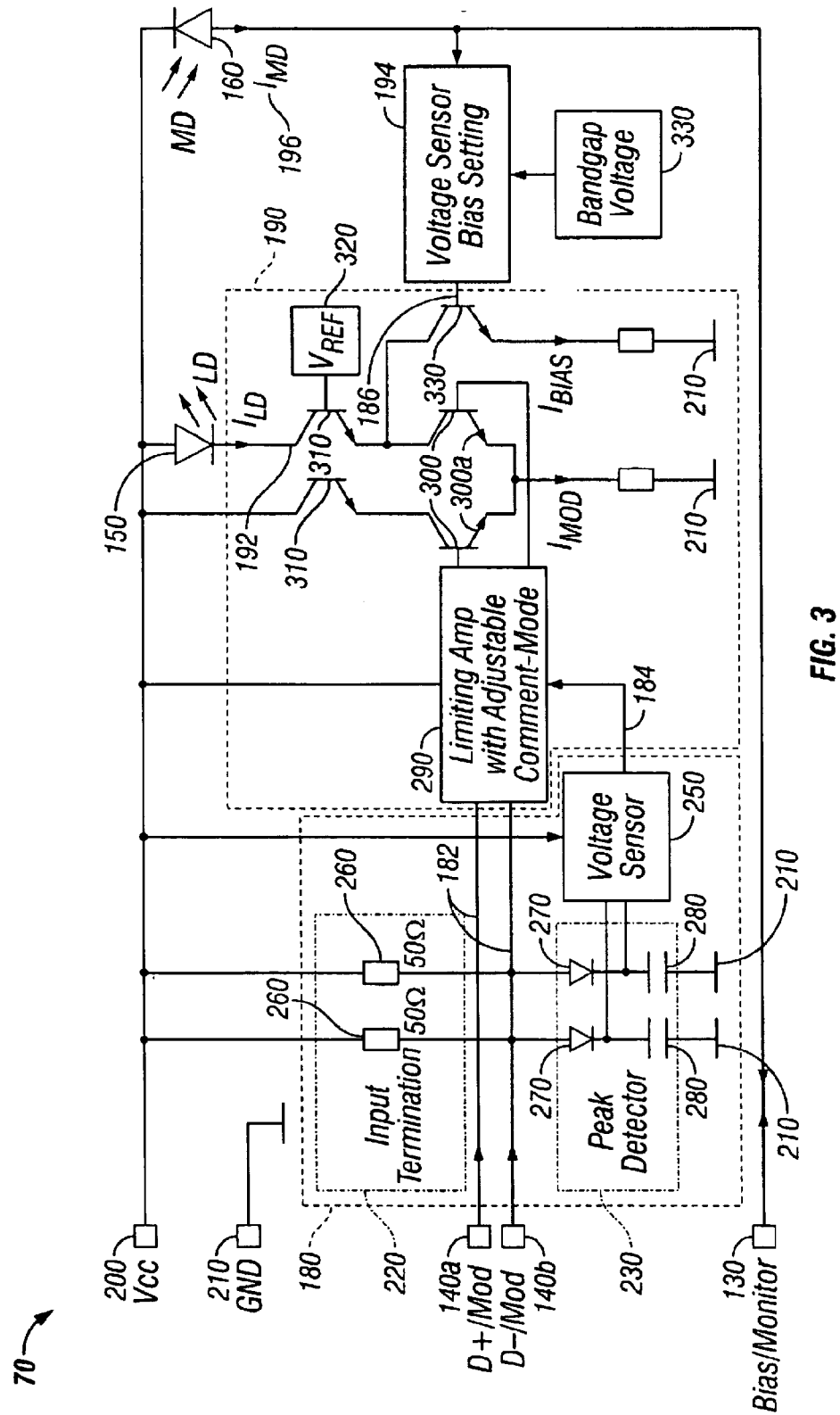
FIG. 3 is a circuit diagram of a laser driver, in accordance with the present invention.

FIG. 3 is a circuit diagram of a laser driver 70, in accordance with the present invention. The laser driver 70 includes a common mode sensor 180 coupled to a pair of differential inputs 140a and 140b, a pair of differential signal outputs 182 and a modulation control output 184. An output driver 190 is coupled to the pair of differential signal outputs 182, the modulation control output 184, a bias control input 186 and a laser signal output 192. Also included is a voltage sensor 194 coupled to a monitor diode current input 196, the bias control input 186 of the output driver 190 and the bi-directional input/output 130.

The common mode sensor further comprises an input termination 220, a peak detector 230 and a voltage sensor 250. The input termination includes a pair of resistors 260 each coupled to a power supply 200 and each resistor 260 is also coupled to an individual differential output 140a and 140b. The peak detector includes a pair of diodes 270 and a pair of capacitors 280 each coupled in series with the input termination 220 and a ground 130. The voltage sensor is coupled to the power supply 200, the peak detector 230 and the output driver 190 via the modulation control input 184.

The output driver includes a limiting amplifier 290 coupled to the pair of differential signal outputs 182, the modulation control output 184, a power supply 200 and a first pair of NPN transistors 300 wherein an emitter 300a of each NPN transistor 300 are both coupled to a ground 210. A second pair of NPN transistors 310 is coupled to the first pair of NPN transistors 300, a voltage reference 320, a power supply 200 and the laser signal output 192. Also included is NPN transistor 330 coupled to the first pair of NPN transistors 300 and the second pairs of NPN transistors 310, the ground 210 and the voltage sensor 194. Also included is a bandgap voltage reference 330. The laser driver 70 is also coupled to the laser diode 150 and the monitor diode 160.

Figure 4A:
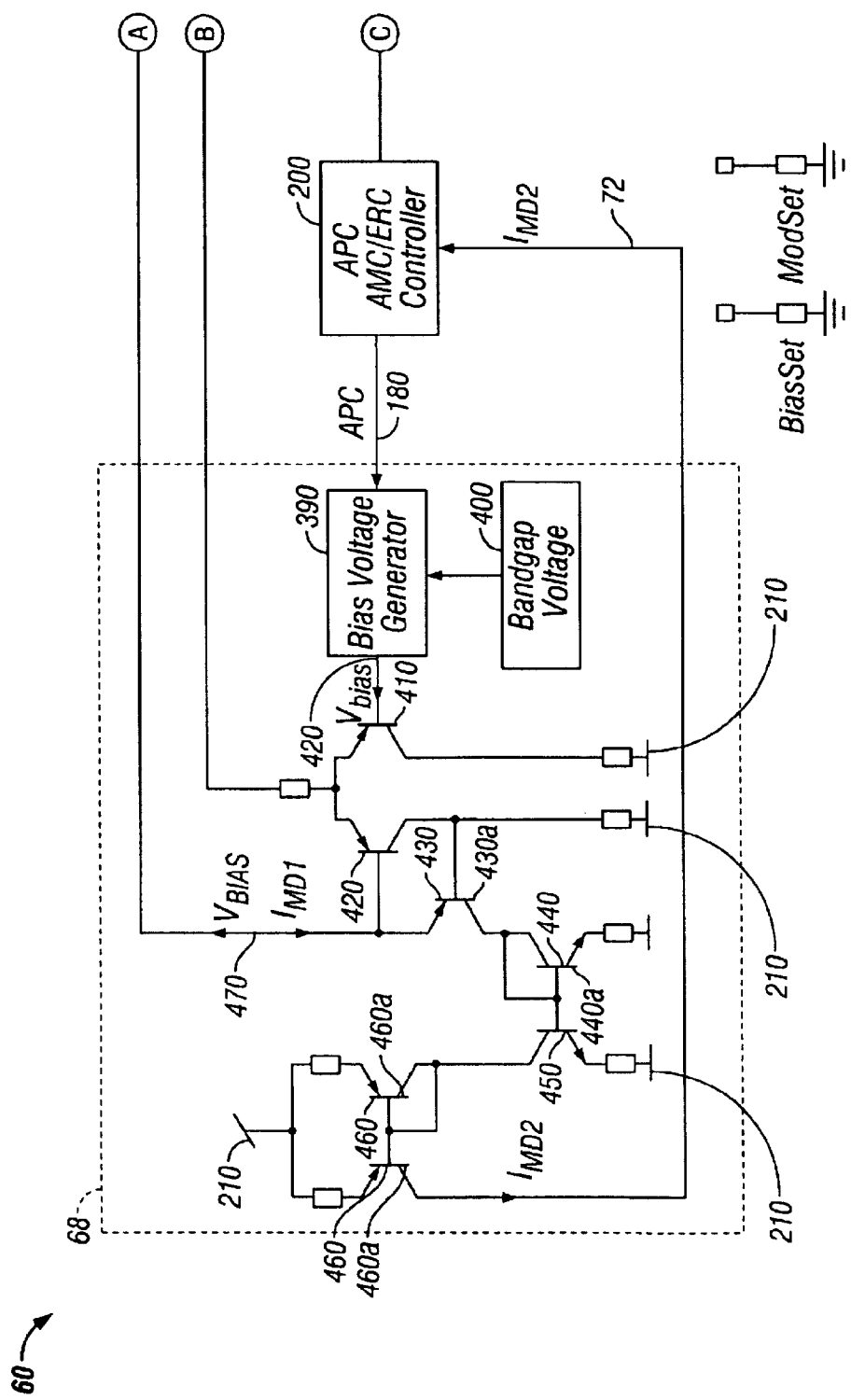
FIGS. 4A and 4B is a circuit diagram of a pre-driver, in accordance with the present invention.
Figure 4B:
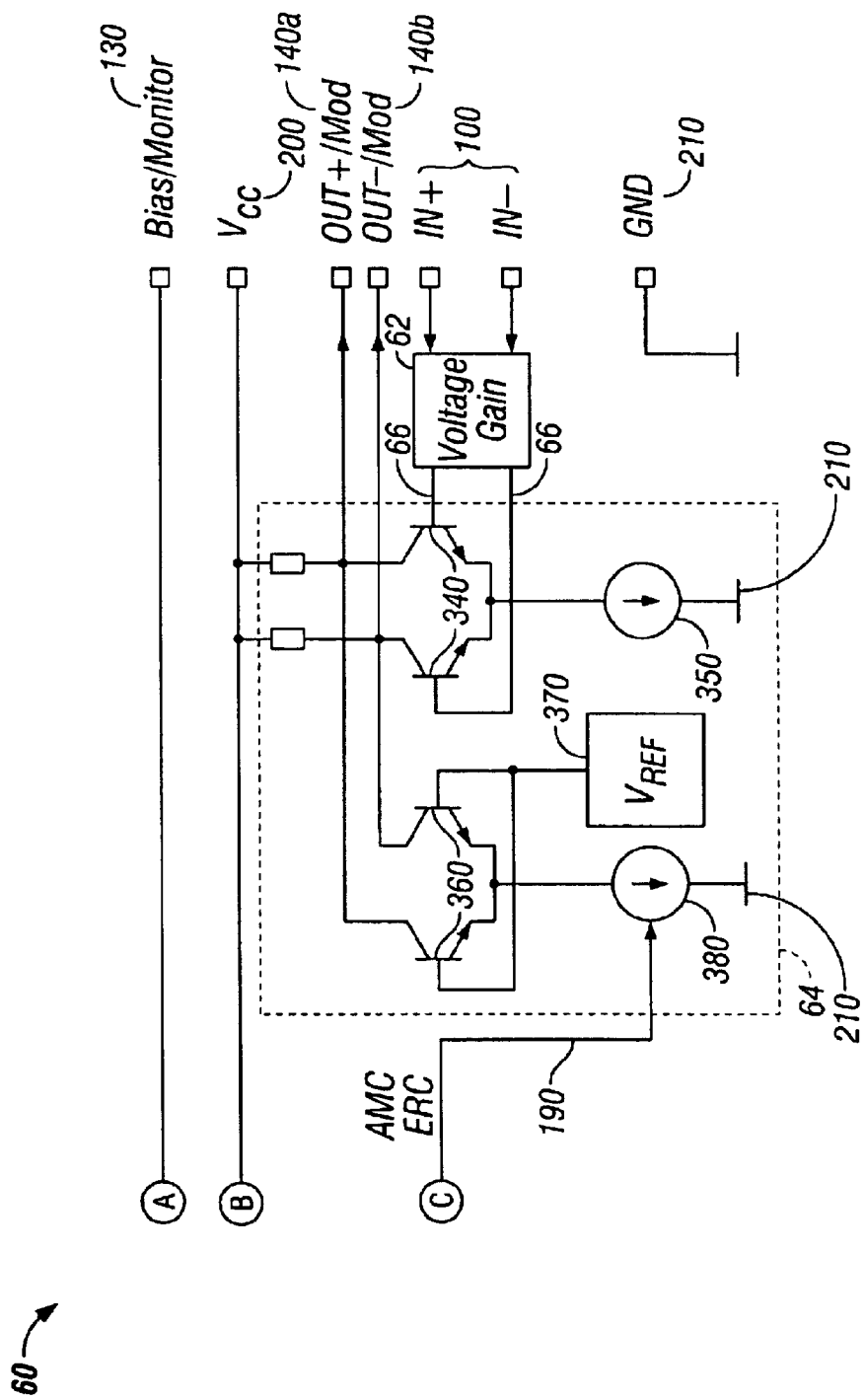

FIGS. 4A and 4B is a circuit diagram of a pre-driver 60, in accordance with the present invention. The pre-driver circuit 60 includes a gain stage 62 coupled to a pair of differential inputs 100. An output driver 64 is coupled to a pair of outputs 66 of the gain stage 62, a pair of differential outputs 140a and 140b and a modulation control input 190. A current sensor/voltage driver 68 is coupled to a bi-directional input/output 130, a bias control input 180 and an output 72. Also included is an APC and AMC/ERC controller 200 that is coupled to the bias control input 180, the output 72 of the current sensor/voltage driver 68 and the modulation control input 190.

The output driver 64 includes a first pair of NPN transistors 340 coupled to the power supply line 200, the pair of differential outputs 66 and an input of a first current source 350. A second pair of NPN transistors 360 is coupled to the pair of differential outputs 140a and 140b, a voltage reference 370 and a second current source 380 wherein the second current source 380 is also coupled to the APC and AMC/ERC controller 200.

The current sensor/voltage driver 68 includes a bias voltage generator 390 coupled to the bias control input 180 and a bandgap voltage reference 400. A first PNP transistor 410 is coupled to the bias voltage generator 390, the power supply 200 and a ground 210. A second PNP transistor 420 coupled to the power supply 200, the bias control input 130, and the ground 210. A third PNP transistor 430 is coupled to the bias control input 130 and the ground 210. A first NPN transistor 440 coupled to the third PNP transistor 430 and the ground 210. A second NPN transistor 450 is coupled to the ground 210 wherein a base 440a of the first NPN transistor 440 is coupled to a collector 430a of the first NPN transistor 430. Also included is a pair of PNP transistors 460 coupled to the ground 210 and the output of the current sensor/voltage driver 72 wherein both bases 460a of the pair of PNP transistors 460 are coupled to the second NPN transistor 450.

It will be appreciated by one skilled in the art that the design of the laser driver and the pre-driver circuits are exemplary implementations and that other equivalent designs can be realized that are still within the scope of the present invention.

Referring back to FIG. 3, the design of the laser driver 70 and pre-driver 60 guarantees that bias sensing voltage and the photo current will not interfere with each other, even though they both utilize pin 130. The voltage at node 470, on FIG. 4, is floating and is equivalent to the voltage at node 480 due to the design of pre-driver 60. The current $I_{MD2}$ is always equal to $I_{MD1}$, regardless of voltage because of the application of current mirrors consisting of the first NPN transistor 440, the second NPN transistor 450 and the pair of PNP transistors 460.

Figure 5A:
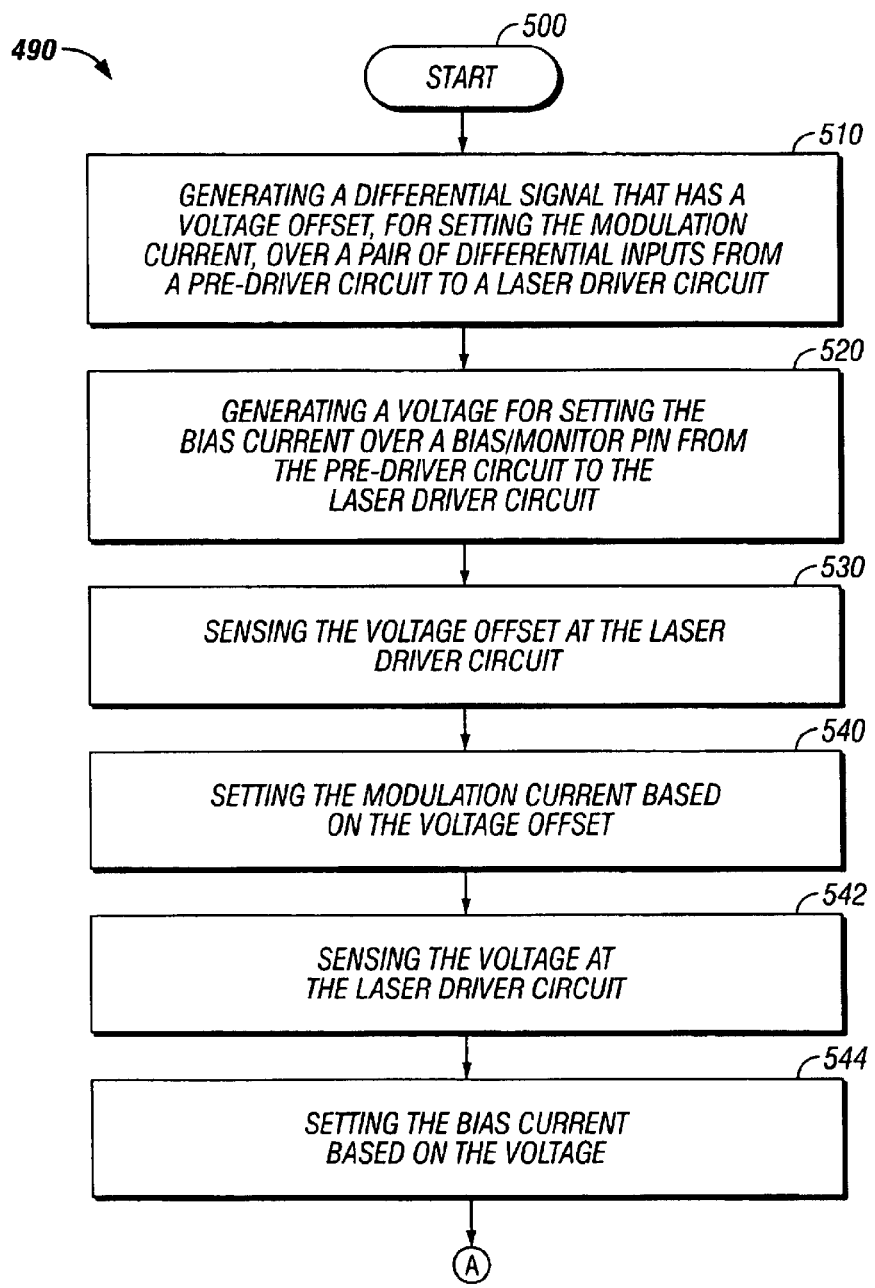
FIG. 5 is a flowchart describing a method for controlling a modulation current and a bias current of a laser driver, in accordance with the present invention.
Figure 5B:
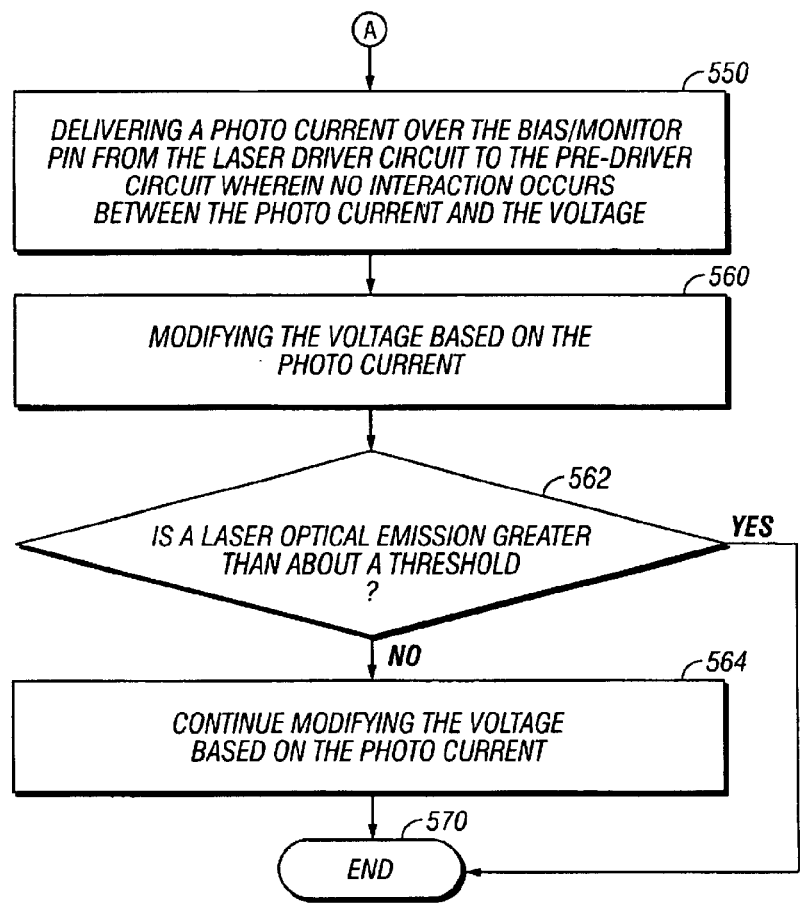

FIG. 5 is a flowchart 490 describing a method for controlling a modulation current and a bias current of a laser driver, in accordance with the present invention. The method begins at step 500 and a differential signal is generated that has a voltage offset, for setting the modulation current, over a pair of differential inputs from a pre-driver circuit to a laser driver circuit, at step 510. At step 520, a voltage is generated for setting the bias current over a bias/monitor pin from the pre-driver circuit to the laser driver circuit. The voltage offset is then sensed at the laser driver circuit, at step 530, and the modulation current is set based on the voltage offset, at step 540. At step 542, the voltage is sensed at the laser driver circuit. At step 544, the bias current is set, based on the voltage A photo current is then delivered over the bias/monitor pin from the laser driver circuit to the pre-driver circuit wherein no interaction occurs between the photo current and the voltage, at step 550. The voltage is modified based on the photo current at step 560. At decision point 560, it is determined if the laser optical emission is greater than about a threshold. If the answer is no, the voltage will continue to be modified based on the photo current until it reaches the threshold. Otherwise, the method then completes at step 570.

The present invention allows for the advantages of incorporating the APC and AMC/ERC into a pre-driver circuit and yet still utilize a smaller package size for the laser and laser driver assembly, that only has five pins to connect to a pre-driver circuit.

In addition to the above mentioned examples, various other modifications and alterations of the invention may be made without departing from the invention. Accordingly, the above disclosure is not to be considered as limiting and the appended claims are to be interpreted as encompassing the true spirit and the entire scope of the invention.

What is claimed is:

1. A method for controlling a modulation current and a bias current of a laser driver comprising:
   generating a differential signal that has a voltage offset, for setting the modulation current, over a pair of differential inputs from a pre-driver circuit to a laser driver circuit;
   generating a voltage for setting the bias current over a bias/monitor pin from the pre-driver circuit to the laser driver circuit;
   sensing the voltage offset at the laser driver circuit;
   setting the modulation current based on the voltage offset;
   sensing the voltage at the laser driver circuit;
   setting the bias current based on the voltage;
   delivering a photo current over the bias/monitor pin from the laser driver circuit to the pre-driver circuit wherein no interaction occurs between the photo current and the voltage; and
   modifying the voltage based on the photo current.

2. A pre-driver circuit, for controlling a laser driver, that generates a differential signal which includes an offset component and is communicated over a pair of differential inputs to a laser driver circuit, the pre-driver circuit operable to generate a laser driver bias voltage on a bias/monitor pin, the laser driver bias voltage intended to control a bias current of the laser driver, the pre-driver circuit responsive to a photo current generated at the laser driver and received over the bias/monitor pin, the pre-driver circuit arranged such that the laser driver bias voltage and the photo current do not substantially interfere with each other.

3. The pre-driver circuit as recited in claim 2 wherein the photo current is used to modify the voltage offset component.

4. A pre-driver circuit as recited in claim 2 wherein the photo current is used by the pre-driver circuit to modify the laser driver bias voltage.

5. A pre-driver circuit as recited in claim 2 wherein the photo current is used by the pre-driver circuit to modify a common mode voltage of the differential signal.

6. A pre-driver circuit as recited in claim 2 wherein the photo current is used by the pre-driver circuit to modify both the offset component and the laser driver bias voltage.

7. A system for controlling a modulation current and a bias current of a laser driver comprising:
   a pre-driver circuit receptive to a differential signal, a bias set voltage, a modulation set voltage and a photo current and operative to develop an offset differential signal and a voltage wherein the photo current is utilized for setting an offset component of the offset differential signal; and
   a laser driver circuit receptive to the offset differential signal and the voltage and operative to develop the photo current wherein the laser driver circuit uses the offset component of the offset differential signal to set a modulation current and the voltage for setting a bias circuit.

8. An apparatus for controlling a modulation current and a bias current of a laser driver comprising:
   means for generating a differential signal that has a voltage offset, for setting the modulation current, over a pair of differential inputs from a pre-driver circuit to a laser driver circuit;
   means for generating a voltage for setting the bias current over a bias/monitor pin from the pre-driver circuit to the laser driver circuit;
   means for sensing the voltage offset at the laser driver circuit;
   means for setting the modulation current based on the voltage offset;
   means for sensing the voltage at the laser driver circuit;
   means for setting the bias current based on the voltage;
   means for delivering a photo current over the bias/monitor pin from the laser driver circuit to the pre-driver circuit wherein no interaction occurs between the photo current and the voltage; and
   means for modifying the voltage based on the photo current.

9. A pre-driver circuit that in combination with a laser driver circuit is suitable for controlling a laser, the pre-driver circuit characterized in that said pre-driver circuit is operable to generate a laser driver bias voltage on a bias/monitor pin, the laser driver bias voltage intended to control a bias current of the laser driver circuit, the pre-driver circuit responsive to a photo current generated by the laser driver circuit and received at the pre-driver circuit over the bias/monitor pin, the pre-driver circuit arranged such that the laser driver bias voltage and the photo current do not substantially interfere on the bias/monitor pin.

10. A pre-driver circuit as recited in claim 9, the pre-driver circuit further characterized in that the pre-driver circuit monitors the photo current and adjusts the laser driver bias voltage as a function of the photo current to better control the laser.

11. A pre-driver circuit as recited in claim 9, the pre-driver circuit further providing a differential signal for driving the laser driver circuit, the pre-driver circuit further characterized in that the pre-driver circuit monitors the photo current and adjusts the differential signal as a function of the photo current to better control the laser.

12. A pre-driver circuit as recited in claim 11, wherein the differential signal includes an offset component, the pre-driver circuit characterized in that the pre-driver circuit adjusts the offset component as a function of the photo current.

13. A pre-driver circuit for use with a laser driver circuit in providing control of a laser, the pre-driver circuit characterized in that the pre-driver circuit is capable of sending a control signal to the laser driver circuit on a bi-directional input/output, and receive a feedback signal over the bi-directional input/output, the pre-driver circuit responsive to the feedback signal, the pre-driver circuit arranged such that the feedback signal and the control signal do not substantially interfere with each other.

14. A pre-driver circuit as recited in claim 13, wherein said control signal is a voltage signal, and the feedback signal is a current signal.

15. A pre-driver circuit as recited in claim 13, wherein the control signal is a current signal, and the feedback signal is a voltage signal.

* * * * *